(12) United States Patent
Hanawa et al.

(10) Patent No.: US 8,455,374 B2
(45) Date of Patent: Jun. 4, 2013

(54) RADIATION HEATING EFFICIENCY BY INCREASING OPTICAL ABSORPTION OF A SILICON CONTAINING MATERIAL

(75) Inventors: Hiroji Hanawa, Sunnyvale, CA (US); Kyawwin Jason Maung, Daly City, CA (US)

(73) Assignee: Applied Materials, Inc., Santa Clara, CA (US)

( * ) Notice: Subject to any disclaimer, the term of this patent is extended or adjusted under 35 U.S.C. 154(b) by 220 days.

(21) Appl. No.: 13/093,584

(22) Filed: Apr. 25, 2011

(65) Prior Publication Data

US 2011/0272709 A1 Nov. 10, 2011

Related U.S. Application Data

(60) Provisional application No. 61/332,162, filed on May 6, 2010.

(51) Int. Cl.
*H01L 21/00* (2006.01)

(52) U.S. Cl.
USPC ......................................... 438/790; 438/787

(58) Field of Classification Search
USPC ................................. 438/787, 790
See application file for complete search history.

(56) References Cited

U.S. PATENT DOCUMENTS

| | | | |
|---|---|---|---|
| 6,334,404 B1 * | 1/2002 | Liu et al. | 118/723 R |
| 2003/0049580 A1 | 3/2003 | Goodman | |
| 2005/0120961 A1 * | 6/2005 | Kubo | 118/728 |
| 2006/0060145 A1 | 3/2006 | Van Den Berg et al. | |
| 2007/0194411 A1 * | 8/2007 | Nakamura et al. | 257/633 |
| 2008/0124470 A1 * | 5/2008 | van den Berg et al. | 427/348 |
| 2010/0148415 A1 * | 6/2010 | Nakamura et al. | 269/289 R |
| 2011/0052833 A1 * | 3/2011 | Hanawa et al. | 427/534 |
| 2012/0089117 A1 * | 4/2012 | Junginger et al. | 604/506 |

FOREIGN PATENT DOCUMENTS

| JP | 2009-149964 | 7/2009 |
|---|---|---|
| JP | 2010-056561 | 3/2010 |

OTHER PUBLICATIONS

International Search Report and Written Opinion dated Jan. 5, 2012 for PCT International Application No. PCT/US2011/033818.

* cited by examiner

*Primary Examiner* — Victor A Mandala
(74) *Attorney, Agent, or Firm* — Patterson & Sheridan, LLP

(57) ABSTRACT

Embodiments of the present invention generally provide a process and apparatus for increasing the absorption coefficient of a chamber component disposed in a thermal process chamber. In one embodiment, a method generally includes providing a substrate carrier having a first surface and a second surface, the first surface is configured to support a substrate and being parallel and opposite to the second surface, subjecting the second surface of the substrate carrier to a surface treatment process to roughen the second surface of the substrate carrier, wherein the substrate carrier contains a material comprising silicon carbide, and forming an oxide-containing layer on the roughened second surface of the substrate carrier. The formed oxide-containing layer has optical absorption properties at wavelengths close to the radiation delivered from one or more energy sources used to heat the chamber component.

17 Claims, 4 Drawing Sheets

RADIATION HEATING EFFICIENCY BY INCREASING OPTICAL ABSORPTION OF A SILICON CONTAINING MATERIAL

CROSS-REFERENCE TO RELATED APPLICATIONS

This application claims benefit of U.S. Provisional Patent Application Ser. No. 61/332,162, filed May 6, 2010, entitled "IMPROVED RADIATION HEATING EFFICIENCY BY INCREASING ABSORPTION OF A SILICON CONTAINING MATERIAL", which is herein incorporated by reference.

BACKGROUND OF THE INVENTION

1. Field of the Invention

Embodiments of the present invention generally relate to improved processes and apparatus for improving radiation absorption of a substrate carrier and other chamber components that are made from or coated with a silicon carbide material.

2. Description of the Related Art

In semiconductor processing, multiple substrates are often loaded onto substrate carriers. The substrate carriers are typically utilized to transfer substrates into and out of processing chambers and may also be utilized to support substrates during processing. For example, substrates, such as sapphire substrates used in manufacturing of light emitting diodes (LEDs), are usually processed in a batch. A batch of substrates are positioned in a substrate carrier and the substrate carrier is transferred into the chamber where the substrates are processed, and then transferred out of the chamber after processing is complete.

In thermal process, the substrate carrier and surfaces of the processing chamber are heated by radiation from a radiant heating source that is used to heat the substrates. However, since radiant heating source utilize heating elements, e.g., lamps, placed outside of the processing chamber, the ability to control the temperature in the processing chamber (especially at temperatures greater than about 900° C.) becomes more difficult as the chamber surfaces become coated with materials or other reaction products used in the processing chamber. Materials deposited on the chamber surfaces not only reduce the heating efficiency of the heat transfer between the radiant heating sources and the substrates but also limit the maximum processing temperature that can be achieved by the substrates, causing thermal uniformity across the surface of the substrate to suffer. While the chamber can be cleaned often to increase the effectiveness of the heating, the resultant downtime of the chamber increases the cost of processing substrates.

Therefore, there is a need for improved processes and apparatus that allow for higher processing temperatures to be achieved by more efficient, uniform heat transfer from the radiant heating sources to the substrates.

SUMMARY OF THE INVENTION

Embodiments of the present invention generally provide a process and apparatus for increasing the absorption coefficient of a chamber component disposed in a thermal process chamber. The thermal process chamber may be used to deposit Group III-nitride films using a thermal process such as a metal oxide chemical vapor deposition (MOCVD) process, a hydride vapor phase epitaxy (HVPE) deposition process, or a rapid thermal process (RTP) process. As will be discussed in more detail below, embodiments of the present invention increase the absorption coefficient of a substrate carrier and/or other chamber components that are made from or coated with a silicon carbide material by mechanically and/or electrochemically modifying properties of the silicon carbide surface exposed to radiation power delivered from radiant heating sources. The modified surfaces change the substrate carrier's optical absorption properties at wavelengths close to the radiation delivered from radiant heating sources. The heating efficiency of one or more substrates disposed on the substrate carrier is increased since more of the heat is absorbed by the substrate carrier that has optical absorption properties close to the radiation delivered from the radiant heating sources.

In one embodiment, a method of processing a chamber component used in a semiconductor process chamber is provided. The method generally includes providing a substrate carrier having a first surface and a second surface, the first surface is configured to support one or more substrates and being parallel and opposite to the second surface, subjecting the second surface of the substrate carrier to a surface treatment process to roughen the second surface of the substrate carrier, wherein the substrate carrier contains a material comprising silicon carbide, and forming an oxide-containing layer on the roughened second surface of the substrate carrier. The oxide-containing layer may be silicon oxides and can be formed by exposing the second surface to an oxidizing atmosphere at a temperature of, for example, above about 800° C., or by an electrolysis process immersing the roughened second surface in an electrolyte (e.g., an aqueous sodium chloride (NaCl) salt solution) and electrically biasing the substrate carrier relative to an electrode immersed in the electrolyte.

In another embodiment, a substrate carrier used in a semiconductor process chamber is provided. The substrate carrier includes a body having a first surface and a second surface, the first surface being opposite to the second surface and is configured to support one or more substrates, wherein the body comprises a carbon-containing material (such as silicon carbide (SiC) or SiC coated graphite), and wherein the second surface comprises a heat absorption layer in direct contact with the second surface. The heat absorption layer may be an oxide-containing material such as silicon oxides. Alternatively, the heat absorption layer may be silicon carbide nanostructures. In one example, the second surface and/or the heat absorption layer may have a surface roughness (Ra) of between about 0.5 and about 60 micro-inches, for example between about 20 micro-inches and about 50 micro-inches.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Figure 1:
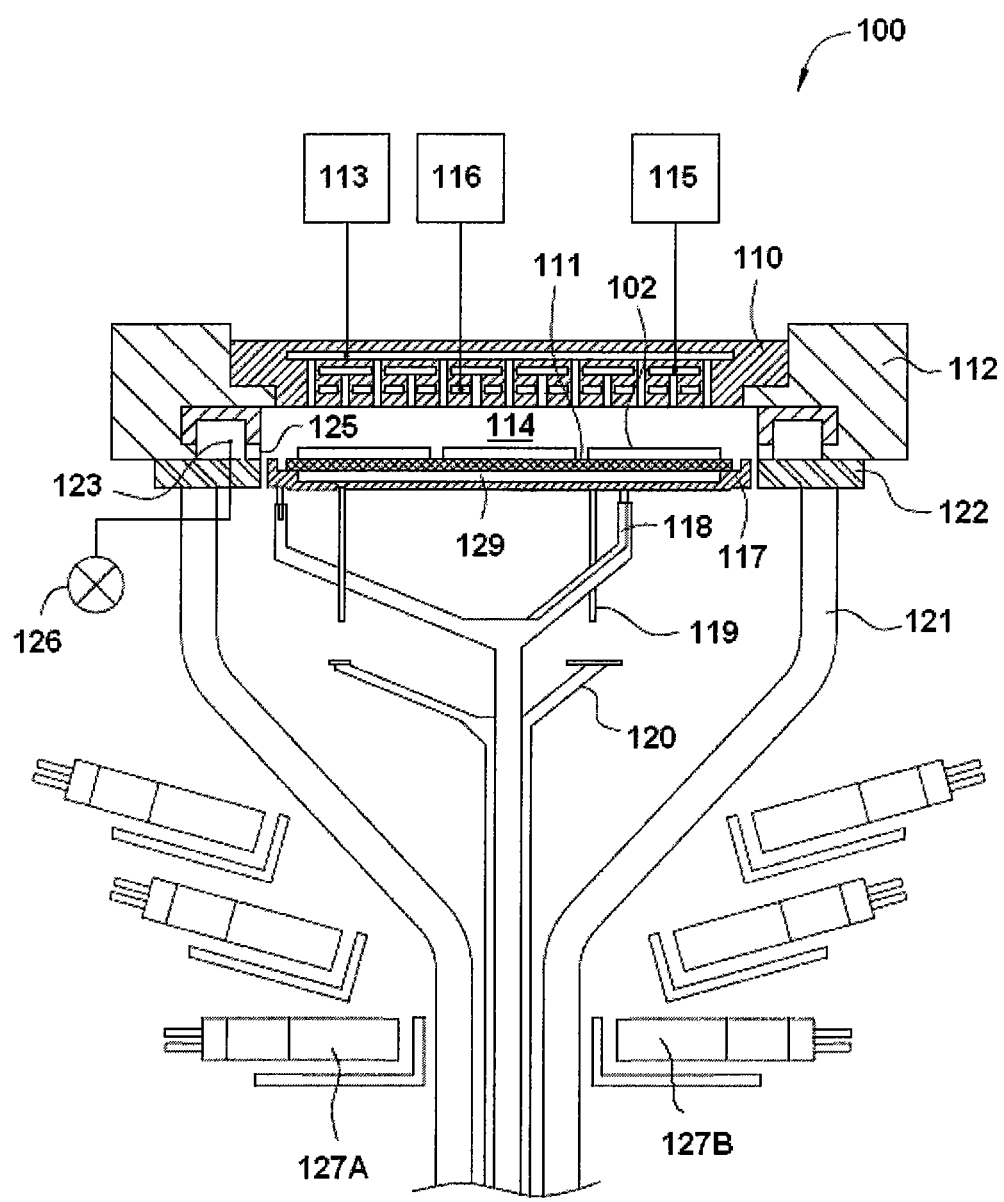
FIG. 1 illustrates a schematic cross-sectional view of a metal-organic chemical vapor deposition (MOCVD) chamber that may benefit from one or more embodiments of the present invention.

FIG. 1 is a schematic cross-sectional view of a process chamber 100 that may benefit from one or more embodiments of the present invention. The process chamber 100 shown is a metal organic chemical vapor deposition (MOCVD) chamber configured to perform a thermal based vapor deposition process on a plurality of substrates 102, which are disposed on a substrate carrier 111 during processing. In a metal nitride formation process, the substrates 102 may be heated up to about 450° C. to about 1100° C. While the discussion below primarily describes one or more of the embodiments that may be practiced in a MOCVD chamber, this process chamber type is not intended to be limiting as to the scope of the invention described herein. Process chambers that may benefit from the present invention include any thermal process chambers such as chemical vapor deposition (CVD) chambers, hydride vapor phase epitaxy (HVPE) deposition chambers, rapid thermal process (RTP) chamber, or any process chambers using lamp heating applications.

The process chamber 100 generally has a processing volume 114 defined by a showerhead assembly 110, sidewalls 112, an exhaust ring assembly 122, and a lower dome 121. The showerhead assembly 110 is connected to precursor sources 113, 115 and provides passages between the precursor sources 113, 115 and the processing volume 114. The showerhead assembly 110 is also connected to a cooling fluid source 116 configured to provide cooling to the showerhead assembly 110. The exhaust ring assembly 122 has a circular exhaust volume 123 which is coupled to a vacuum system 126. The circular exhaust volume 123 is in fluid communication with the processing volume 114 via a plurality of holes 125. The holes 125 are evenly distributed around the processing volume 114. During processing, precursors and processing gases may flow into the processing volume 114 through the showerhead assembly 110 and exit the processing volume 114 under vacuum force from the vacuum system 126 via the plurality of holes 125 and the circular exhaust volume 123.

The process chamber 100 also includes a substrate susceptor 117 configured to receive and support the substrate carrier 111 thereon. The susceptor 117 is disposed on a supporting shaft 118 which is configured to support and rotate the susceptor 117 and the substrate carrier 111 during processing. Three or more lifting pins 119 are movably disposed on the susceptor 117. A carrier lift shaft 120 is configured to move the lifting pins 119 up and down relative to the susceptor 117. When lifted, the lifting pins 119 can receive the substrate carrier 111 for a transfer mechanism or lift the substrate carrier 111 from the susceptor 117.

The process chamber 100 further includes one or more heating lamps 127A, 127B configured to provide heat energy to the processing volume 114 via the lower dome 121, which is usually made from infrared transparent material, such as quartz. The substrates 102 are heated by the heating assembly 224 through the susceptor 117 and the substrate carrier 111. In one embodiment, the susceptor 117 only contacts the substrate carrier 111 at an edge region of the substrate carrier 111. A uniform spacing 129 may be formed between the substrate carrier 111 and the susceptor 117 to assure uniform heat transferring between the susceptor 117 and the substrate carrier 111. The substrate carrier 111 is designed to provide uniform heat transfer between the substrate carrier 111 and each substrate 102. The substrate carrier 111 is also designed to provide a steady support for each substrate 102 during processing.

Figure 2A:
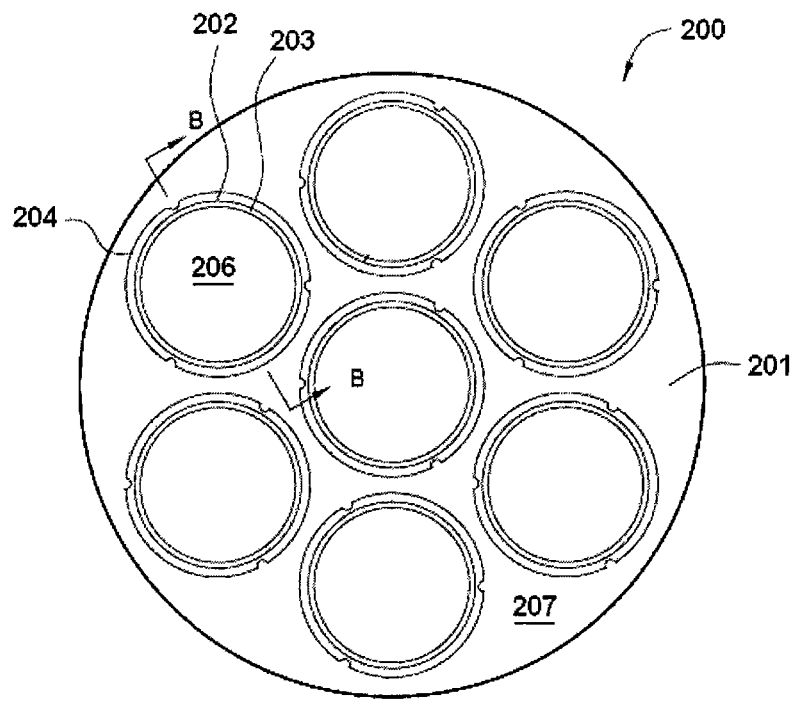
FIG. 2A illustrates a top view of an exemplary substrate carrier that may be used in the process chamber shown in FIG. 1.
Figure 2B:
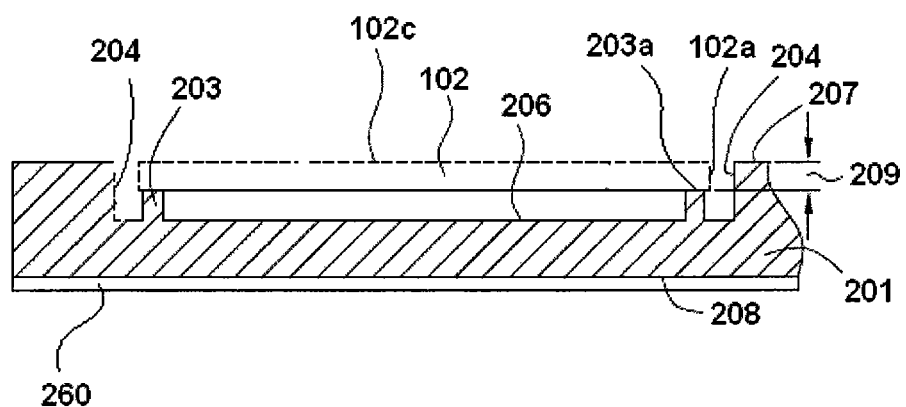
FIG. 2B illustrates a partial side view the substrate carrier taken along line B-B in FIG. 2A.

FIG. 2A illustrates a top view of an exemplary substrate carrier 200 that may be used in a thermal process chamber, such as the process chamber 100 shown in FIG. 1. FIG. 2B illustrates a partial side view the substrate carrier 200 taken along line B-B in FIG. 2A.

The substrate carrier 200 generally comprises a carrier body 201 configured to provide structural support to one or more substrates 102 thereon. In one embodiment, the carrier body 201 may have a substantially disk shape. The carrier body 201 may comprise a material which has similar thermal properties, such as similar thermal expansion, with as the substrates 102 to avoid unnecessary relative motion between the carrier body 201 and the substrates 102 during heating and/or cooling. In one embodiment, the carrier body 201 may include silicon carbide. In one example, the carrier body 201 is formed from solid silicon carbide. In another embodiment, the carrier body 201 may include a core and a coating over the core formed by a silicon carbide material. In one example, the carrier body 201 of the substrate carrier 200 may have a graphite core coated with a silicon carbide material.

The carrier body 201 of the substrate carrier 200 may be a circular disk having a planar back surface 208 and a top surface 207 with a plurality of pockets 202 formed thereon. Each pocket 202 is configured to retain one substrate 102 therein. The plurality of pockets 202 may be formed on the carrier body 201 to effectively use surface areas of the carrier body 201. In one embodiment, the plurality of pockets 202 are arranged in a circular fashion with one pockets 202 being positioned in the centered of the disk shaped carrier body 201 and six pockets 202 equally spaced surrounding the pocket 202 in the center, as shown in FIG. 2A. The plurality of pockets 202 may form two or more concentric circles on the disk shaped carrier body 201 depending on sizes of the substrate carrier 200 and the substrate 102.

The pockets 202 are generally recesses formed in the body 201 of the substrate carrier 200. Each pocket 202 has sidewalls 204 and a bottom surface 206 defining a recess. The sidewalls 204 define an area slightly larger than the substrate 102 so that an edge 102a of the substrate 102 is not in contact with the sidewalls 204. In one embodiment, the inner diameter of each pocket 202 may be lager in diameter than the substrate being supported.

Optionally, a raised ring 203 may be formed extending from the bottom surface 206 to provide an upper surface 203a for supporting the substrate 102. The raised ring 203 may be formed radially inward of the sidewalls 204 at a desired distance. The upper surface 203a is configured to support a small portion of a back side of the substrate 102 to reduce contact areas between the substrate 102 and the substrate carrier 200. By reducing contact areas between the substrate 102 and the substrate carrier 200, deformation of the substrate 102, for example bowing, will be less likely to happen. Bowing of the substrate may reduce the amount of heat transfer near the center of the substrate and results in uneven heating of the substrate in general. Alternatively, the substrate 102 may be placed flat on the bottom surface 206 of the substrate carrier without using the raised ring 203. In cases where the raised ring 203 is desired, an elevation difference 209 between the upper surface 203a and the top surface 207 of the carrier body 201 may be substantially similar to the thickness of the substrate 102 held therein. As a result, a top surface 102c of the substrate 102 levels with the top surface 207 of the carrier body 201. Leveling the top surface of the substrate 102 and the top surface 207 of the substrate carrier 200 may help reduce interruptions to fluid flow over the substrate carrier 200 during process. In one embodiment, the carrier body 201 may have a thickness of about 1.5 mm to about 3.0 mm. The height difference between the bottom surface 206 of the substrate carrier 200 and the upper surface 203a of the raised ring 203 may between about 0.13 mm and about 0.5 mm.

Improved Radiation Heating Hardware

In an effort to reduce the inherent thermal non-uniformity created by delivering energy from the plurality of discrete radiant heating sources to a large surface area of substrate carrier, for example the substrate carrier 111, 200 shown in FIGS. 1 and 2, the substrate carrier may be rotated relative to the radiant heating sources at a rate between about 2-100 rpm to average out any spatial non-uniformity in the energy delivered from the radiant heat sources (e.g., lamps 127A and 127B shown in FIG. 1). It has been found that by improving the optical properties (e.g., absorption coefficient) of at least a surface of the substrate carrier, the thermal uniformity and maximum achievable temperature reached by the substrates at a fixed energy flux from the lamps 127A, 127B can be greatly improved.

Figure 3A:
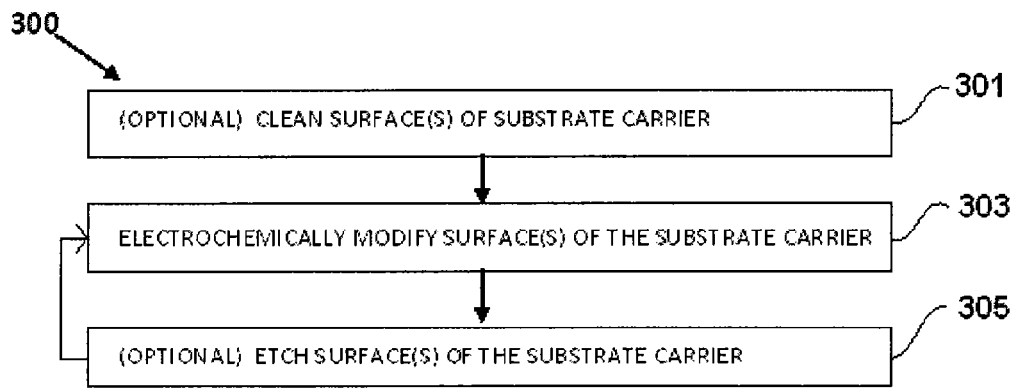
FIG. 3A illustrates a processing sequence used to modify one or more of the surfaces of a chamber component used in the process chamber shown in FIG. 1.

FIG. 3A illustrates a processing sequence 300 used to modify one or more of the surfaces of a chamber component used in a thermal process chamber, such as the process chamber 100 shown in FIG. 1. In various embodiments, the chamber component to be modified may include a material that has good thermal conductivity and is able to withstand the high processing temperatures (e.g., >800° C.) used to process substrates 102 in the processing volume 114 of the process chamber 100. The chamber component may be made from a variety of materials, including silicon carbide (SiC), SiC-coated graphite, boron nitride or other similar material. In the embodiments described in reference to FIGS. 3A and 3B, a substrate support, for example, the substrate carrier 111, 200 shown in FIGS. 1 and 2A, is used as an example. It may be advantageous for the substrate carrier to have physical properties similar to the substrates, such as a similar coefficient of thermal expansion, to avoid unnecessary relative motion between the surface of the substrate carrier and the substrates during heating and/or cooling. In one embodiment, the substrate carrier (e.g., substrate carrier 111, 200 shown in FIGS. 1 and 2A) may include silicon carbide material coated thereon or made from a solid silicon carbide material to withstand the thermal stress induced by the radiant heating sources. The substrate carrier may have a surface area of about 1,000 cm$^2$ or more, for example about 2,000 cm$^2$ or more, or preferably about 4,000 cm$^2$ or more. It should be noted that while the substrate carrier is used in the embodiments of the invention, the similar approach is also applicable to other chamber components that is made of silicon carbide or has silicon carbide coating formed thereon.

At box 301, the surfaces of the substrate carrier 200 may be optionally cleaned in a process chamber using a cleaning process. The substrate carrier 200 may be exposed to a wet cleaning solution that is configured to remove any undesirable contaminants from the surfaces of the substrate carrier 200.

At box 303, the surfaces of the substrate carrier 200 are electrochemically modified to improve its ability to absorb energy delivered from the lamps 127A, 127B during a subsequent metal nitride formation process. In one embodiment, the back surface 208 of the substrate carrier 200 is electrochemically modified since the back surface 208 is the primary surface receiving heat energy from the lamps 127A, 127B. Therefore, prior to the electrochemical modification process, the front surface of the substrate carrier 200 may be masked with a protective film 410 (FIG. 4) to prevent the front surface from being modified during the process. The front surface generally include the top surface 207, the bottom surface 206, the raised ring 203 or surfaces of the substrate carrier 200 facing a direction away from the back surface 208. The protective film 410 may include one or more layers of polyimide film, such as KAPTON® tape (commercially available from Dupont). The substrate carrier 200 having the front surface protected is then processed with the electrolysis process, which will be discussed in conjunction with FIG. 4.

Figure 4:
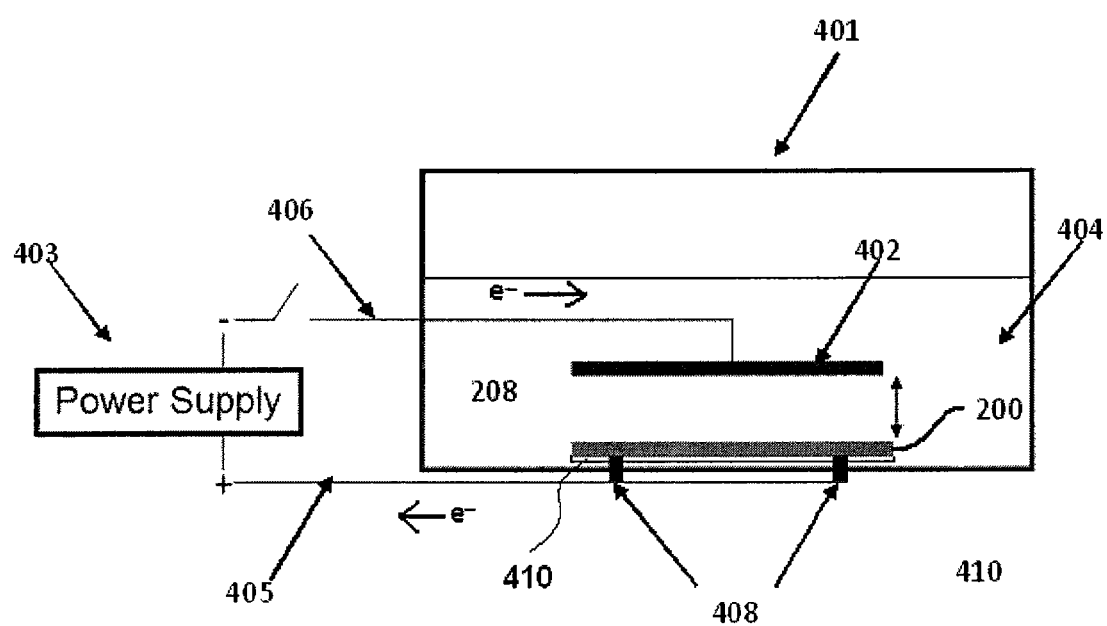
FIG. 4 illustrates a simplified illustration of a chemical tank used to perform electrochemical modification process according to embodiments of the present invention.

FIG. 4 shows a simplified illustration of a chemical tank 401 used to perform the electrolysis process. The chemical tank 401 as shown generally includes an electrolyte 404 filled in the chemical tank 401, two electrodes (i.e., a cathode electrode 402 and an anode substrate carrier 200) immersed in the electrolyte 404, and a power supply 403 connecting to the substrate carrier 200 and the electrode 402 using the electrical leads 405, 406, respectively, to provide the energy necessary to create or discharge the ions in the electrolyte 404. The term "electrolyte" as referred to in the present invention means any substance that dissociates into two or more ions which are mobile and free to move when dissolved in water, or any substance that will conduct an electric current when in solution. In one embodiment, the electrolyte may use fused salt mixtures containing, for example, sodium chloride, calcium chloride, calcium fluoride, lithium chloride, potassium chloride, lithium bromide, potassium bromide, or the like. In one example, a water-soluble electrolyte using sodium chloride (NaCl) is used considering their low original cost. In such a case, the electrode 402 which used as a cathode may be a chlorine resistant electrode made of, for example, graphite, or an inert metal such as platinum, gold, silver, or an alloy which is inert chemically, for example, silicon carbide. In one example, the electrode 402 is graphite or silicon carbide electrode.

The chamber component to be modified, e.g., the substrate carrier 200, is disposed in the chemical tank 401 and serves as an anode. The substrate carrier 200 and the electrode 402 may be positioned parallel to each other and separated by a distance of about 2-5 inches. The substrate carrier 200 may be supported by a plurality of electrode supports 408 with the back surface 208 to be modified facing upward and the front surface covered by the protective film 410 being in contact with the electrode supports 408. During the electrolysis process, the electrolyte 404 in the chemical tank 401 is exposed to the air. The substrate carrier 200 is anodically biased relative to the electrode 402 immersed in the electrolyte 404 containing an aqueous sodium chloride (NaCl) salt solution using the power supply 403. The electrical potential is applied across the substrate carrier 200 and the electrode 402 immersed in the electrolyte 404, causing sodium ions (Na$^+$) and chloride ions (Cl$^-$) derived from the dissolution of NaCl migrated to opposite electrodes. That is, sodium ions ($Na^+$) move towards the negative charged electrode 402 while chloride ions ($Cl^-$) move towards the positive charged electrode, i.e., the substrate carrier 200, allowing the continued flow of electricity. Meanwhile, the water in the electrolyte 404 is also dissociated into hydrogen ions ($H^+$) and hydroxide ions ($OH^-$) due to the electric current being passed through the water. The sodium ions ($Na^+$) and the hydroxide ions ($OH^-$) in the electrolyte 404 are reacted to produce caustic soda (NaOH), which is known as a strong base. The back surface 208 of the substrate carrier 200, which is formed from a silicon carbide material, reacts with caustic soda (NaOH) and converted a portion of the silicon carbide to a thin layer of oxide-containing materials. In cases where silicon carbide materials is used for the substrate carrier 200, the formed oxide-containing material may be a silicon oxide ($Si_xO_y$) containing layer, for example, silicon dioxide ($SiO_2$). In a processing time of about 10 minutes, the thickness of the oxide materials formed on the back surface 208 may be between about 8 Å and about 20 Å on a substrate carrier 200 that is about 350 mm in diameter.

In one embodiment, the substrate carrier 200 is disposed in the chemical tank 401 using a sodium chloride (NaCl) electrolyte at a concentration of about 5.7 pounds per gallon of water (i.e., at NaCl/water ratio about 1:10). The substrate carrier 200 is biased relative to an electrode 402 (e.g., graphite or silicon carbide electrode) for about 10 minutes at a electrolyte temperature of about 150° C. to about 850° C., for example, about 200° C. to about 500° C., and at a voltage between about 6 volts and about 20 volts to achieve a current of about 5 amps to about 10 amps, for example, about 6.6 amps, on a substrate carrier 200 that is about 350 mm in diameter and about 17 mm in thickness. It is believed that using this electrochemical modification process on the substrate carrier 200 having silicon carbide exposed on its surfaces, the back surface 208 of the substrate carrier 200 may be modified so that a thin layer of silicon oxide ($Si_xO_y$) is formed thereon in a manner as described above.

Alternatively, the silicon oxide ($Si_xO_y$) layer may be formed on the surfaces of the substrate carrier 200 in a dry atmosphere, rather than the electrochemical modification process using the electrolyte as described above. In such a case, the back surface 208 of the substrate carrier 200 may be exposed to an oxidizing atmosphere (e.g., dry oxygen and optionally hydrogen gas) in a furnace at a high temperature of about 800° C. or above to form a thin layer of silicon dioxide on the back surface 208. If desired, the formed silicon dioxide may be annealed in a nitrogen-containing atmosphere to improve oxide reliability.

In either case, the silicon dioxide layer formed on the back surface 208 of the substrate carrier 200 advantageously results in improved radiation heating efficiency because silicon oxides is known to have several strong infrared absorption bands throughout the infrared wavelengths due to Si—O bonds in silicon oxide films. By physically or chemically modifying the back surface 208 of the substrate carrier 200 to change its optical absorption properties at wavelengths more close to the radiation delivered from the lamps 127A, 127B (which emit radiation over a large wavelength range from the visible to the far infrared), the amount of the infrared radiation received by the substrate carrier 200 during a subsequent metal nitride formation process is significantly improved.

In certain applications, instead of forming silicon oxides, the surfaces of the substrate carrier 200 may be modified by forming silicon carbide (SiC) nanostructures on one or more surfaces (e.g., back surface 208) of the substrate carrier 200. Nanostructures of silicon carbide formed on the surface of the substrate carrier 200 is believed to be able to enhance radiation absorption and thus heating efficiency of the substrate carrier due to increased particle surface area of the nanostructures. In such a case, SiC nanostructures may be formed on at least the back surface 208 of the substrate carrier 200 by providing and dissolving a silicon-containing source gas on metallic catalyst particles (e.g., iron, nickel, or cobalt etc.) disposed on the back surface 208 of the substrate carrier 200. The nanostructures of silicon carbide is then formed by reactions between the dissolved source gas and the metallic catalyst particles using a thermal chemical vapor deposition (CVD) process.

At box 305, the modified surface (e.g., the back surface 208) of the substrate carrier 200 may be optionally etched using an etching process to create microscopic scale textures such as pores or craters, thereby improving its ability to trap radiation energy delivered from the lamps 127A, 127B during a high temperature metal nitride formation process. It has been found that heat transfer from the substrate carrier 200 to the substrate 102 can be made uniform by using a substrate carrier 200 with a minimum surface roughness because more heat absorption sites are provided for the substrate carrier 200. In one embodiment, the etching process may include exposing the back surface 208 of the substrate carrier 200 to an etching solution comprising hydrofluoric acid (HF) and nitric acid ($HNO_3$). In one example, the etching solution may be consisted of about 10 to about 50 weight percent of nitric acid ($HNO_3$) and about 5 to about 40 weight percent of hydrofluoric acid (HF). Phosphoric acid (H3PO4) may be used depending upon the application. The etching solution removes at least a portion of the silicon oxide layer formed on the back surface 208 to increase its roughness. After etching process, the back surface 208 may have a surface roughness (Ra) of about 0.5 to about 60 micro-inches, for example, between about 15 and about 50 micro-inches, such as between about 20-40 micro-inches. It is contemplated that other roughening techniques such as mechanical roughening process may be used to obtain similar microscopic scale textures. As the roughness increase is predominantly in the micrometer range, the common mechanical roughening process, such as bead blasting, may be used to roughen the surface on a more macroscopic scale. In cases where SiC nanostructures are formed on the modified surface (e.g., the back surface 208) of the substrate carrier 200, a grinding process or abrading process using a diamond saw or diamond impregnated belt may be used considering the high hardness of the silicon carbides.

After the processes at box 305 have been performed, the processes performed at box 303 may be performed again to further modify the back surface 208 of the substrate carrier 200. In this configuration, an electrochemically-modified surface is formed over the roughened surfaces that were created during the one or more of the steps found in boxes 303 and/or box 305, thereby enhancing the absorption coefficient of the substrate carrier 200. Alternatively, the processes described at box 303 and box 305 may be performed multiple times on the back surface 208 of the substrate carrier 200 to achieve desirable absorption coefficient in the near infrared radiation range. In either case, the process described at box 301 may be optionally performed to remove any undesirable contaminants produced during the processes.

Figure 3B:
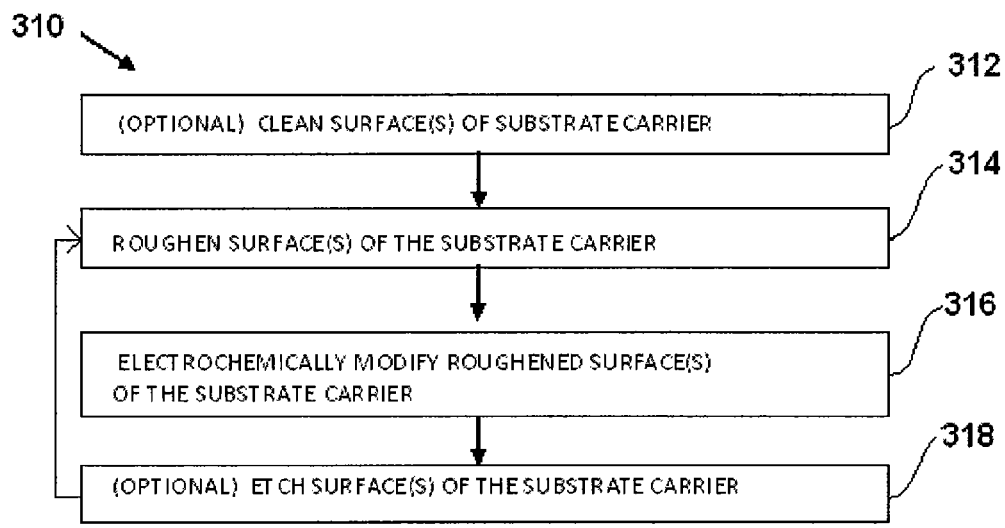
FIG. 3B illustrates an alternative processing sequence used to modify one or more of the surfaces of a chamber component used in the process chamber shown in FIG. 1.

FIG. 3B illustrates an alternative processing sequence 310 used to modify one or more of the surfaces of a chamber component used in a thermal process chamber, such as the process chamber 100 shown in FIG. 1. In this alternative embodiment, a surface treatment process may be additionally performed prior to the electrochemical modification process of box 303 to improve the absorption of heat delivered from the lamps 127A, 127B to the surface of the chamber component (e.g., substrate carrier 111, 200 shown in FIGS. 1 and 2A) during a subsequent metal nitride formation process.

At box 312, the surfaces of the substrate carrier 200 is optionally cleaned in a process chamber in a manner as described above with respect to box 301 to remove any undesirable contaminants from the surfaces of the substrate carrier 200.

At box 314, the surfaces of the substrate carrier 200 are roughened using a surface treatment process to improve the absorption of heat delivered from the lamps 127A, 127B to the surfaces of the substrate carrier 200 during a subsequent metal nitride formation process. In one example, the back surface 208 of the substrate carrier 200 is roughened since the back surface 208 is the primary surface receiving heat energy from the lamps 127A, 127B. The surface treatment process may increase surface roughness of the substrate carrier 200 and therefore more heat absorption sites available for the substrate carrier 200. Thus, increased heating efficiency of the substrate is obtained. The surface treatment process may be a mechanical texturing process such as, for example, bead blasting, abrasive blasting, sand blasting, grinding, embossing, or the like, which introduces a desired surface roughness on the surfaces of the substrate carrier 200.

In one example, a surface grinding process is used to produce a surface roughness (Ra) of about 0.5 to 60 micro-inches, for example, between about 15 and 50 micro-inches, such as between about 20-40 micro-inches, on the back surface 208 of the substrate carrier 200. The surface grinding process may also help clean the back surface 208 of the substrate carrier 200 by removing any loosely adhered particles on the substrate carrier 200. It may be advantageous to mechanically roughen the surfaces of the substrate carrier 200 using a diamond saw or diamond impregnated belt since it is typical to form a substrate carrier 200 from silicon carbide, which has a hardness close to a diamond. Other surface treatment processes such as chemical etching, electrochemically etching, or dry etching may be used to provide the substrate carrier 200 with a desired surface roughness (Ra).

The term chemically etching herein is meant to generally describe, but is not limited to, the process of removing material from the surface of a workpiece by the use of chemical activity. An example of typical chemicals that could be used may be aqueous acidic solutions, containing such acids as sulfuric acid ($H_2SO_4$), nitric acid ($HNO_3$), hydrochloric acid (HCl) or combination thereof, or aqueous basic solutions containing such chemicals as potassium hydroxide (KOH), ammonia hydroxide ($NH_4OH$) or combination thereof. The term electrochemically etching is meant to generally describe, but is not limited to, the process of removing material from the surface of a workpiece by the application of an anodic bias to the workpiece relative to another element that acts as a cathode and is also submerged in an electrolyte solution. Dry etching is generally a process of generating a plasma to energize or dissociate reactive gas species that interact with and ultimately remove material from the workpiece surfaces. These surface treatment processes can be alternatively or additionally used to achieve desired surface roughness.

At box 316, the back surface 208 of the substrate carrier 200 are electrochemically modified to improve its ability to absorb energy delivered from the lamps 127A, 127B during a subsequent metal nitride formation process. The back surface 208 of the substrate carrier 200 may be electrochemically modified in a manner similar to the processes performed at box 303 as discussed above.

At box 318, the modified surface (e.g., the back surface 208) of the substrate carrier 200 are optionally roughened using an etching process to create microscopic scale textures such as pores or craters, thereby further improving its ability to trap radiation energy delivered from the lamps 127A, 127B during a high temperature metal nitride formation process. The modified surfaces (e.g., the back surface 208) of the substrate carrier 200 may be roughened in a manner similar to the processes performed at box 305 as discussed above.

After the processes at box 318 have been performed, the processes performed at box 314 and box 316 may be performed again to obtain desired surface roughness and optical properties (i.e., absorption coefficient) of the substrate carrier 200. Alternatively, the processes described at box 314, box 316 and box 318 may be performed multiple times on the back surface 208 of the substrate carrier 200 to maximize radiation heating efficiency of the process. The back surface 208 of the substrate carrier 200 process may be optionally cleaned using processes described at box 312 to remove any undesirable contaminants produced during the processes.

Embodiments of the present invention increase the absorption coefficient of a substrate carrier and/or other chamber components that are made from or coated with a silicon carbide material by mechanically and/or electrochemically modifying properties of the silicon carbide surface exposed to radiation power delivered from radiant heating sources. The modified surfaces form a thin layer of an oxide-containing material or silicon carbide nanostructures 260 (FIG. 2B), which change the chamber component's optical absorption properties at wavelengths close to the radiation delivered from the radiant heating sources. The heating efficiency of the one or more substrates disposed on the chamber component (e.g., substrate carrier) is increased since more of the heat is absorbed by the substrate carrier that has optical absorption properties close to the radiation delivered from the radiant heating sources. It has been observed that by performing the processing techniques of the present invention, the substrate temperature during a nitride formation process can be increased by at least 20° C. at a processing temperature of about 900° C., which equals to about 8-9% increase in power delivery, without the need of using extra lamps or high performance lamps.

While the foregoing is directed to embodiments of the present invention, other and further embodiments of the invention may be devised without departing from the basic scope thereof, and the scope thereof is determined by the claims that follow.

The invention claimed is:

1. A method of processing a substrate carrier used in a semiconductor process chamber, comprising:
   providing a substrate carrier having a first surface and a second surface, the first surface being opposite to the second surface and is configured to support one or more substrates thereon;
   subjecting the second surface of the substrate carrier to a surface treatment process to roughen the second surface of the substrate carrier, wherein the substrate carrier contains a material comprising silicon carbide; and
   forming an oxide-containing layer on the roughened second surface of the substrate carrier by immersing the roughened second surface in an electrolyte and electrically biasing the substrate carrier relative to an electrode immersed in the electrolyte.

2. The method of claim 1, wherein forming the oxide-containing layer on the roughened second surface of the substrate carrier comprises:

exposing the second surface to an oxidizing atmosphere at a temperature above about 800° C.

3. The method of claim 1, wherein the electrolyte comprises sodium ions (Na$^+$) and chloride ions (Cl$^-$).

4. The method of claim 3, wherein the electrolyte further comprises hydrogen ions (H$^+$) and hydroxide ions (OH$^-$).

5. The method of claim 4, wherein the oxide-containing layer is formed on the roughened second surface of the substrate carrier using caustic soda (NaOH).

6. The method of claim 1, wherein the surface treatment process introduces a surface roughness (Ra) of between about 15 and about 50 micro-inches on the second surface of the substrate carrier.

7. The method of claim 1, wherein the oxide-containing layer comprises silicon oxide.

8. The method of claim 1, wherein the electrode comprises graphite or silicon carbide.

9. The method of claim 1, wherein the electrolyte comprises sodium chloride, calcium chloride, calcium fluoride, lithium chloride, potassium chloride, lithium bromide or potassium bromide.

10. A method of processing a substrate carrier used in a semiconductor process chamber, comprising:
providing a substrate carrier having a first surface and a second surface, the first surface being opposite to the second surface and is configured to support one or more substrates thereon;
subjecting the second surface of the substrate carrier to a surface treatment process to roughen the second surface of the substrate carrier, wherein the substrate carrier contains a material comprising silicon carbide;
forming an oxide-containing layer on the roughened second surface of the substrate carrier; and
after forming the oxide-containing layer on the roughened second surface, etching the substrate carrier to provide pores on the oxide-containing layer.

11. A substrate carrier used in a semiconductor process chamber, comprising:
a body having a first surface and a second surface, the first surface being opposite to the second surface and is configured to support one or more substrates thereon;
wherein the body comprises a carbon-containing material, and wherein the second surface comprises a heat absorption layer in direct contact with the second surface, wherein the heat absorption layer comprises silicon carbide nanostructures.

12. The substrate carrier of claim 11, wherein the heat absorption layer comprises an oxide-containing material.

13. The substrate carrier of claim 12, wherein the oxide-containing material comprises silicon oxides.

14. The substrate carrier of claim 12, wherein the heat absorption layer has a surface roughness (Ra) of between about 15 and about 50 micro-inches.

15. The substrate carrier of claim 11, wherein the heat absorption layer has a surface roughness (Ra) of between about 20 and about 40 micro-inches.

16. The substrate carrier of claim 11, wherein the second surface has a surface roughness (Ra) of between about 15 and about 50 micro-inches.

17. A substrate carrier used in a semiconductor process chamber, comprising:
a body having a first surface and a second surface, the first surface being opposite to the second surface and is configured to support one or more substrates thereon;
wherein the body comprises a carbon-containing material comprising silicon carbide (SiC) or SiC coated graphite, and wherein the second surface comprises a heat absorption layer in direct contact with the second surface, wherein the heat absorption layer comprises silicon carbide nanostructures.

* * * * *